United States Patent [19]
Wallace et al.

[11] Patent Number: 6,071,751
[45] Date of Patent: Jun. 6, 2000

[54] DEUTERIUM SINTERING WITH RAPID QUENCHING

[75] Inventors: Robert M. Wallace, Richardson; Kenneth C. Harvey, Dallas, both of Tex.

[73] Assignee: Texas Instruments Incorporated, Dallas, Tex.

[21] Appl. No.: 09/123,265

[22] Filed: Jul. 28, 1998

[51] Int. Cl.[7] .................................................. H01L 29/76
[52] U.S. Cl. .......................... 438/38; 257/607; 257/608; 257/609; 257/610; 257/611; 257/612; 438/38; 438/37; 438/36; 438/35
[58] Field of Search ..................... 257/607, 629, 257/142, 608, 609, 610, 617, 611, 612, 347, 66; 438/38

[56] References Cited

U.S. PATENT DOCUMENTS

| | | | |
|---|---|---|---|
| 3,849,204 | 11/1974 | Folwer ...................................... | 148/1.5 |
| 3,923,559 | 12/1975 | Sinha ........................................ | 148/1.5 |
| 4,113,514 | 9/1978 | Panhove et al. ........................... | 148/1.5 |
| 4,151,007 | 4/1979 | Levinstein et al. ....................... | 148/1.5 |
| 4,261,753 | 4/1981 | Holcombe et al. ....................... | 106/56 |
| 4,290,825 | 9/1981 | Dearnaley et al. ....................... | 148/33 |
| 4,331,486 | 5/1982 | Chenevas-Paule et al. ............. | 148/1.5 |
| 4,620,211 | 10/1986 | Baliga et al. .............................. | 357/38 |
| 5,179,029 | 1/1993 | Gottscho et al. .......................... | 437/10 |
| 5,248,348 | 9/1993 | Miyachi et al. ........................ | 136/258 |
| 5,250,446 | 10/1993 | Osawa et al. .............................. | 437/24 |
| 5,264,724 | 11/1993 | Brown et al. ............................. | 257/347 |
| 5,571,339 | 11/1996 | Ringel et al. ............................ | 136/252 |
| 5,693,961 | 12/1997 | Hamada ..................................... | 257/66 |
| 5,830,575 | 11/1998 | Warren et al. ........................... | 428/404 |
| 5,872,387 | 2/1999 | Lyding et al. ............................ | 257/607 |
| 5,928,791 | 7/1999 | Rosenmayor .............................. | 428/421 |

OTHER PUBLICATIONS

Wolf, Stanley. Silicon Processing for the VLSI Era, vol. 2: Process Integration pp. 350–356, 1990.

*Primary Examiner*—Charles Bowers
*Assistant Examiner*—Laura N. Schillinger
*Attorney, Agent, or Firm*—Carlton H. Hoel; W. James Brady; Frederick J. Telecky, Jr.

[57] ABSTRACT

Channel-hot-carrier reliability can be improved by deuterium sintering. However, the benefits obtained by deuterium sintering can be greatly reduced or destroyed by thermal processing steps which break Si—H and Si—D bonds. A solution is to increase the deuterium concentration near the interface to avoid subsequent depletion of deuterium due to diffusion. By using a rapid quench of a sintered wafer, the deuterium concentration near the interface is increased, because the rapid quench impedes the ability of the deuterium to diffuse away from the gate oxide interface.

7 Claims, 2 Drawing Sheets

DEUTERIUM SINTERING WITH RAPID QUENCHING

BACKGROUND AND SUMMARY OF THE INVENTION

The present invention relates to fabrication of MOS transistors with reduced susceptibility to channel hot carrier effects, and more specifically to lessened diffusion of deuterium away from the gate oxide interface during thermal processing.

Background: Deuterium Sinter

Recent results have shown that passivation with deuterium instead of hydrogen in the post-metal anneal process is more stable and therefore less likely to succumb to hot electron degradation, resulting in an improvement in channel hot carrier lifetime of 10–100×. See e.g. Kizilyalli et al., "Deuterium Post-Metal Annealing of MOSFET's for Improved Hot Carrier Reliability," 18 IEEE Electron Device Letters, 81 (1997); Lyding et al., "Reduction of Hot Electron Degradation in Metal Oxide Semiconductor Transistors by Deuterium Processing," 68 Applied Physics Letters 18 (1996); Lyding et al., "Reduction of hot electron degradation in metal oxide semiconductor transistors by deuterium processing", 68 Applied Physics Letters 2526 (1996); C. G. Van de Walle and W. B. Jackson, "Comment on 'Reduction of hot electron degradation in metal oxide semiconductor transistors by deuterium processing'", Applied Physics Letters 69 (1996) 2441; all of which are hereby incorporated by reference.

Published works on deuterium sintering to date have been done on devices that have been pulled after the metal-1 metallization step. However, typical process flows for conventional CMOS require many additional levels of metallization and isolation dielectric steps which would result in thermal excursions exceeding the strength of a Si—H or Si—D bond. Once free, both deuterium and hydrogen are mobile and are expected to diffuse from interfacial trap sites. As the structure cools, the broken bonds will be reformed. However, since hydrogen and deuterium are chemically identical, silicon-deuterium re-bonding is not particularly favored over silicon-hydrogen re-bonding. Thus, the subsequent thermal processing is likely to destroy any beneficial effects from an early deuterium sintering process.

As is conventional in furnace operations, the sinter is executed with a controlled heating-rate phase (a controlled "push") and a controlled cooling-rate phase (a controlled "pull"). The controlled pull typically permits the wafer to remain at a temperature consistent with potential Si—H or Si—D bond scission for long periods of time (typically several minutes). This profile, therefore, results in a slow cool down which makes significant diffusion of hydrogen/deuterium away from the interface a likely possibility.

Background: Rapid Quenching

Quenching is an accelerated reduction from an elevated temperature to ambient temperature. Recent results have shown that rapid quenching of protonic memory structures causes interfaces to retain more trapped hydrogen. See U.S. Provisional application No. 60/045,035 filed Apr. 28, 1997 (Att'y docket T-25870P2), which is hereby incorporated by reference.

Deuterium Sintering with Rapid Quenching

The present application discloses a process for retaining a deuterium concentration near a semiconductor/dielectric interface throughout thermal processing steps. The disclosed process includes a rapid temperature-quench of a deuterium-sintered wafer after a high temperature process point (such as after metal-1 sinter ). The rapid quench substantially reduces the ability of hydrogen/deuterium to diffuse away from the gate oxide interface.

Advantages of the disclosed methods and structures include:

Retention of deuterium near the interface throughout thermal processing steps.

Enhanced channel-hot-carrier reliability due to a significant increase in initial deuterium concentration at the gate interface.

Subsequent thermal processing steps are less likely to adversely affect any beneficial effects from the original sintering process.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Overview of Deuterium Sintering with Rapid Quenching

Figure 1:
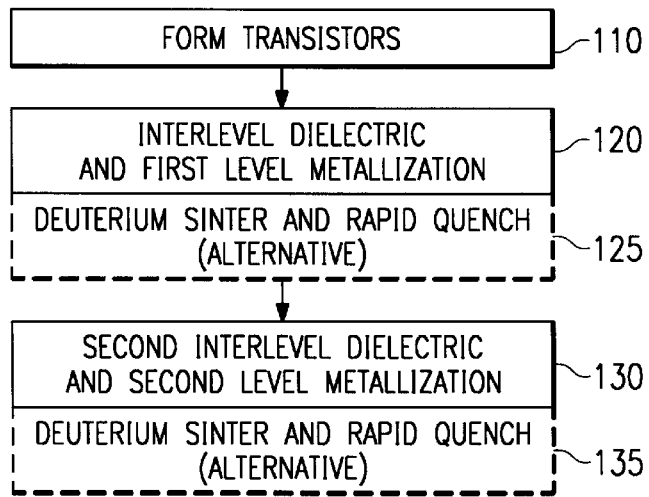
FIG. 1 a process flow for forming a semiconductor integrated circuit using a deuterium sinter with rapid quenching.
Figure 3:
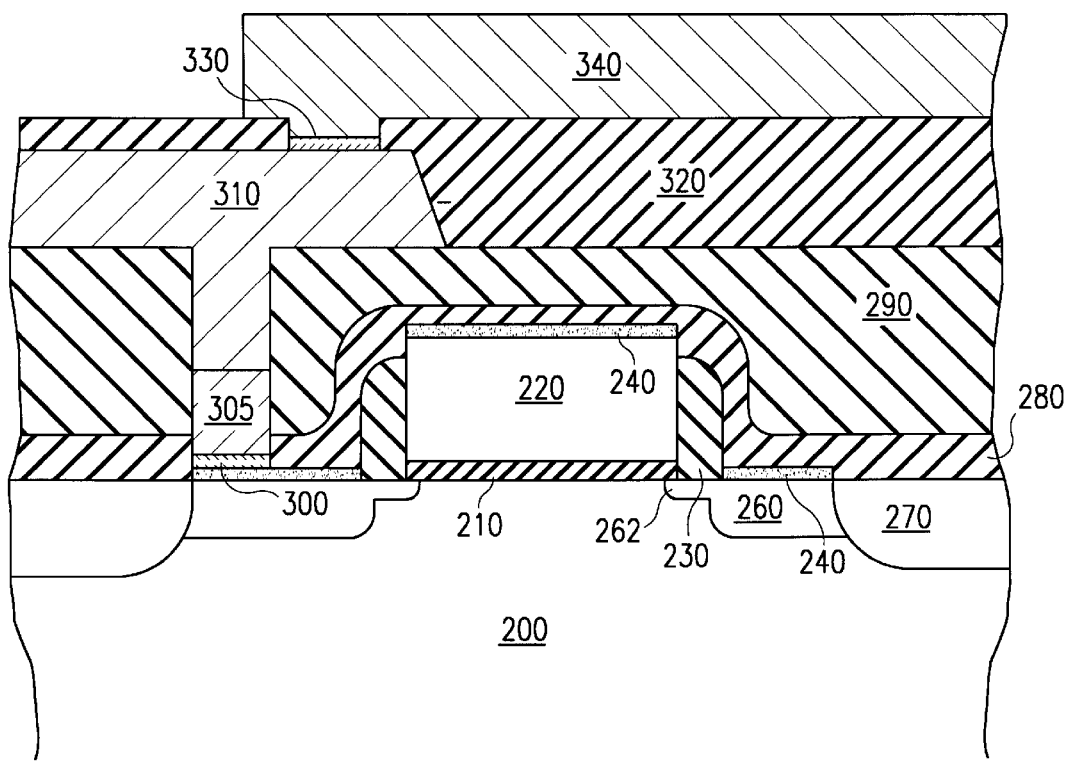
FIG. 3 is a multi-level metal structure formed with deuterium sinter and rapid steps.

FIG. 1 is a process flow for forming a CMOS structure such as the sample embodiment shown in FIG. 3. The steps in FIG. 1 will now be discussed in an overview of the disclosed invention. Details of the structure in FIG. 3 and specific examples are discussed below in a sample embodiment.

A transistor structure is formed with materials and processes as is known in the art at step 110. The transistor structure may comprise source/drain regions 260, shallow S/D extensions 262, shallow trench isolation structures 270, a gate 220, a gate oxide 210, an optional cap oxide over the polysilicon, and nitride sidewall spacers 230 (preferably overlying a thin pad oxide, not shown, on the gate sidewalls), as shown in FIG. 3. Other components which may be desired will be readily apparent to those skilled in the art.

When transistors are complete, a first interlevel dielectric (ILD) is deposited over and across the entire substrate (and any layers already formed thereon). A first contact hole extending through the first interlevel dielectric (and any other dielectric layers) is then formed. This is followed by formation of the first metallization level, completing step 120.

At step 125, the structure is sintered in a deuterium ambient, followed by a rapid temperature quench. The sintering step provides a deuterium concentration at the gate interface. Sample time and temperatures are given below, but these values can be adjusted. The quench is performed to maintain an initially high deuterium concentration and in a manner such that the wafer is not subjected to excess stress.

At step 130, a second interlevel dielectric (ILD) is deposited over and across the entire structure, including metal-1 layer. A pattern of via holes, extending through the second interlevel dielectric to metal-1 layer, is then formed. Metal-2 layer is deposited over and across the entire structure such that the second contact hole is filled. This completes step 130.

This structure is then optionally sintered in a deuterium ambient, followed by rapid quenching of the temperature. This completes step 135.

Preferably no high-temperature steps above 475 degrees C. are used after the quench (or at least after the last such quenching step).

Further layers of metal can be formed following this same cycle. Formation of interconnects and completion of the device proceeds as known in the art.

The deuterium sinter and quench can be done at various points in the process, but later stages of the process are particularly advantageous.

Sample Embodiment

Details of the process flow of FIG. 1 will now be discussed with reference to FIGS. 2 and 3.

Figure 2:
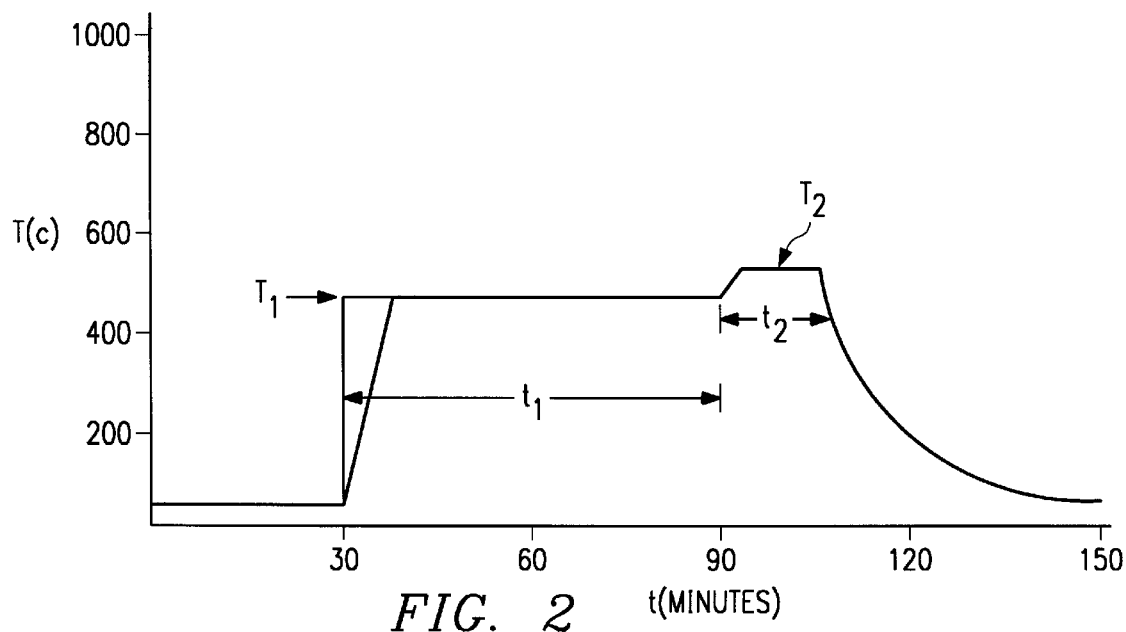
FIG. 2 is graph of time versus temperature during sintering and a subsequent rapid quench.

FIG. 2 shows the thermal cycle for the deuterium sinter with rapid quench steps 125 and 135. The furnace contains a nitrogen ambient during a slow ramp to sintering temperature $T_1$, which is approximately 450 degrees Celsius for this sample embodiment. Sintering is executed in a deuterium containing ambient (10% deuterium and 90% nitrogen, in this sample embodiment), at temperature $T_1$ for time $t_1$ (e.g. approximately 60 minutes). The impurities of hydrogen (H2) and hydrogen-deuterium (HD) in the deuterium source (D2) were minimized in this example (less than 3000 ppm total).

Next, temperature $T_1$ is slowly ramped to temperature $T_2$, which is above the dissociation temperature for Si—H and Si—D bonds, but will be limited by the need to avoid melting of the metallization. In this sample embodiment, $T_2$ was approximately 525 degrees Celsius. This heating causes substantially all silicon-hydrogen and/or silicon-deuterium bonds to be broken. The dissociated deuterium (and hydrogen to some extent) remains near the gate interface. Equilibration with the ambient, however, will reduce the amount of hydrogen near the interface, while leaving the deuterium concentration near the interface unchanged. Temperature $T_2$ is maintained for a relatively short time $t_2$, e.g. 15 minutes in this sample embodiment.

At the end of time $t_2$, the temperature is then rapidly lowered to ambient temperature. In the presently preferred embodiment this was done at a rate of approximately 100 degrees C. per second. (To achieve this the wafer is physically removed into atmospheric ambient, so that rapid convective cooling occurs.) Some benefit can be expected from slower cooling rates, down to one degree C. per second, but faster cooling is preferred. As soon as the temperature reaches approximately 300 degrees C. or less, the furnace is purged with nitrogen.

It is conjectured that the temperature dependence of the solubility and diffusion rates of hydrogen and deuterium may explain part of the benefit of the innovative quenched process.

As the structure cools, hydrogen and deuterium compete for the silicon bonding sites made available by the previous dissociation process at $T_2$.

The initial deuterium sinter and rapid quench created a high D concentration near the interface. The dissociation process reduced the amount of hydrogen near the interface. Deuterium atoms near the interface, therefore, now exceed the number of hydrogen atom competitors near the interface. This results in a greater amount of Si—D bonds, rather than Si—H bonds, being formed at the gate interface. Ideally, more S—D bonding exists then was present after initial sintering.

FIG. 3 shows a structure which is advantageously subjected to the quenched deuterium sinters as described above. Gate dielectric 210 was formed over a semiconductor active area 200. Gate 220 was formed over gate dielectric 210. Sidewall spacers 230 were formed adjacent to gate 220. Source/drain regions 260 and lightly-doped source/drain extension regions 262 are formed by conventional implantation methods.

In preparation for forming contact holes, silicide layer 240 was formed on silicon substrate 200 adjacent to the sidewall spacers 230 and on gate 220. A thin non-doped silicate glass (NSG) layer 280 30 nanometers thick was deposited under Atmospheric Pressure-Chemical-Vapor Deposition (APCVD) conditions. A borophosphosilicate glass (BPSG) first interlevel oxide layer 290, was then deposited over NSG layer 280.

NSG layer 280 and BPSG layer 290 were then densified at 700 degrees Celsius for 50 minutes in a nitrogen ambient. The structure was then planarized and a contact hole was selectively etched through BPSG layer 290, but stopped when it reached silicide layer 240.

An anneal then caused silicide layer 240 to undergo a phase change to its most conductive form. The anneal was for one hour at 585 degrees Celsius in a nitrogen ambient. The diffusion barrier 300 (Ti and TiN) was then deposited.

The contact hole is then filled by a Chemical Vapor Deposition (CVD) nucleated tungsten via plug 305. Tungsten via plug 305 was then etched back, and metal-1 layer 310 was deposited. Metal-1 layer 310 in this sample embodiment was 100 nm of electromigration resistant (copper-doped) aluminum alloy. This completes step 120.

Next, a deuterium sinter with a rapid quench (as described above in reference to FIG. 2) was performed to achieve good semiconductor to metal contact and to passivate dangling bonds at the gate interface. This completes step 125.

After the rapid quench, a second interlevel dielectric layer 320 was then deposited and densified at 400 degrees Celsius for 60 minutes in a nitrogen ambient. The structure was then planarized, and a second contact hole was patterned and etched through second interlevel dielectric layer 320 to first metal layer 310. A second diffusion barrier 330 (e.g., titanium-nitride) contacting first metal layer 310 was formed to partially fill the contact hole. Second metal layer 340 (e.g. 100 nm of an aluminum alloy) was then formed to contact diffusion barrier 330. This completes step 130.

At this point, a further deuterium sinter with a rapid quench (as described above in reference to FIG. 2) can optionally be performed, instead of or in addition to deuterium sinter and quench step 125. This completes optional step 135.

Further conventional processing steps then complete fabrication of the integrated circuit.

The integrated circuit formed according to this sample embodiment has been experimentally tested and found to give good electrical results.

Alternative Embodiment: No Dissociation Step

Rather than heating to temperature $T_2$ to dissociate Si—H and Si—D bonds prior to the rapid quench as in the preferred embodiment, sintering may be immediately followed by the rapid quench.

Alternative Embodiment: Deuterium Sinter and Quench Later in Process

In an alternative embodiment, a deuterium sinter and quench is performed at nearly the end of processing, just prior to deposition of the final silicon nitride protective overcoat. This is particularly advantageous because significant benefits are still obtained, while the process is simplified and the cost associated with using deuterium is reduced.

Alternative Embodiment: Deuterium Sinter and Quench before First Barrier Layer Deposition In an alternative embodiment, a deuterium sinter and quench is performed before the first Ti/TiN barrier layer is deposited. Optionally this can be performed, for example, immediately after the anneal which transforms titanium silicide to its lowest-resistivity phase.

Alternative Embodiment: Quench to Intermediate Temperature

In one contemplated embodiment, the quench does not bring the temperature all the way down to ambient. Instead, the quench only goes down to an intermediate temperature, e.g. 300 C. and is followed by a final cooling step.

Alternative Embodiment: RTA

In another contemplated embodiment, it is contemplated that the deuterium sinter may be done in a rapid thermal annealing ("RTA") reactor. In such reactors the rate of heating and the rate of cooling are both relatively rapid.

Alternative Embodiment: Other Dielectrics

The disclosed process is not only applicable to the silicon/silicon dioxide interface. Interface of silicon (or related semiconductors) to other dielectrics (particularly amorphous dielectrics such as silicon-oxynitride) are likely to include dangling bonds, and can therefore benefit from the claimed inventions (at least in materials systems where the phonon energy levels make deuterium passivation preferable to hydrogen passivation).

Alternative Embodiment: Other Device Contexts

The disclosed process is not only applicable to standard NMOS transistor formation, but is also applicable to PMOS devices, biCMOS processes, floating-gate memory cells, smart power processes, power DMOS processes, etc. For example, the disclosed process can be particularly advantageous with flash memories which use hot-carrier programmation.

Alternative Embodiment: Deuterium/Hydrogen Ambient

Rather than having a fully deuterated ambient with almost no hydrogen, as in the sample embodiment, a less completely deuterated ambient can alternatively be used. Other conditions remain like those stated above.

In practice, significant benefits are predicted when the ambient contains as little as 1% deuterium (although such lower concentrations are less preferred).

According to a disclosed class of innovative embodiments, there is provided: An integrated circuit fabrication method, comprising the steps of: (a.) forming a partially fabricated integrated circuit structure which includes semiconductor/dielectric interfaces; (b.) sintering said structure, in a deuterium-containing ambient, at a first temperature which allows diffusion of deuterium to said interface; (c.) after said sintering step, quenching said structure, at a rate greater than 1 degree Celsius per second, to a second temperature which is less than said first temperature; whereby enhanced deuteration of said interfaces is obtained.

According to another disclosed class of innovative embodiments, there is provided: A fabrication method, comprising the steps of: (a.) forming insulated-gate field-effect transistors, each having an interface between a gate dielectric and a semiconductor channel, and metallic conductors interconnecting said transistors; (b.) sintering at a first temperature, which is greater than 300 degrees Celsius, in an atmosphere containing at least 1% atomic of deuterium; (c.) reducing to a second temperature, which is less than 300 degrees Celsius, at a rate greater than 10 degrees Celsius per second, and switching to an atmosphere containing less than 1% atomic of deuterium.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

In one class of embodiments, the wafer is rapidly cooled within a deuterium ambient, down to an intermediate temperature of 300 C. or less, to ensure that the outdiffusion of deuterium is as low as possible.

While the inventions have been described with primary reference to a single-poly process, it will be readily recognized that these inventions can also be applied to process with two, three, or more layers of polysilicon or polycide.

It should also be noted that the number of layers of metallization described above does not implicitly limit any of the claims, which can be applied to processes and structures with more or fewer layers.

Similarly, it will be readily recognized that the described process steps can also be embedded into hybrid process flows, such as BiCMOS or smart-power processes.

It should also be noted that although quenching and dissociation steps were performed at each metallization step in the sample embodiment, these steps are not required to be performed at each metallization step. Similar benefits can be obtained when quenching and/or dissociation steps are not used at each metallization step. Similar benefits are also predicted when any time a rapid temperature quench follows a high temperature anneal in a deuterium ambient. The method chosen depends on the application and trade-offs between benefits obtained and processing costs.

What is claimed is:

1. An integrated circuit fabrication method, comprising the steps of:
   (a.) forming a partially fabricated integrated circuit structure which includes semiconductor/dielectric interfaces;
   (b.) sintering said structure, in a deuterium-containing ambient, at a first temperature which allows diffusion of deuterium to said interface;
   (c.) after said sintering step, quenching said structure, at a rate greater than 1 degree Celsius per second, to a second temperature which is less than said first temperature;
   whereby enhanced deuteration of said interfaces is obtained.

2. The fabrication method of claim 1, wherein said interfaces are part of field-effect transistors, and said step (b.) is performed after deposition and densification of an interlevel dielectric over said interfaces.

3. The fabrication method of claim 1, wherein said first temperature is greater than 300 degrees Celsius.

4. The fabrication method of claim 1, wherein said first temperature is greater than 300 degrees Celsius, and said second temperature is less than 300 degrees Celsius.

5. The fabrication method of claim 1, wherein said step (b.) is performed after deposition and densification of an interlevel dielectric over said interfaces.

6. The fabrication method of claim 1, wherein said step (b.) is performed in a furnace.

7. The fabrication method of claim 1, wherein said quenching step (c.) is performed at a rate which is greater than 30 degrees Celsius per second.

* * * * *

UNITED STATES PATENT AND TRADEMARK OFFICE
CERTIFICATE OF CORRECTION

PATENT NO. : 6,071,751
DATED : August 16, 2000
INVENTOR(S) : Robert M. Wallace and Kenneth C. Harvey It is certified that error appears in the above-identified patent and that said Letters Patent is hereby corrected as shown below:

<u>Title page,</u>
Insert item [60] under Related U.S. Application Data -- Provisional Application No. 60/053,945 July 28, 1997. --

Signed and Sealed this

Twenty-fifth Day of September, 2001

Attest:

*Nicholas P. Godici*

NICHOLAS P. GODICI
*Attesting Officer*     *Acting Director of the United States Patent and Trademark Office*